United States Patent
McAleenan et al.

(10) Patent No.: US 10,663,562 B2
(45) Date of Patent: May 26, 2020

(54) FREQUENCY MODULATED (FM) CHIRP TESTING FOR AUTOMOTIVE RADARS USING STANDARD AUTOMATED TEST EQUIPMENT (ATE) DIGITAL PIN CHANNELS

(71) Applicant: Advantest Corporation, Tokyo (JP)

(72) Inventors: Roger McAleenan, San Jose, CA (US); Robert Bartlett, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 16/261,425

(22) Filed: Jan. 29, 2019

(65) Prior Publication Data

US 2019/0154798 A1 May 23, 2019

Related U.S. Application Data

(62) Division of application No. 15/076,508, filed on Mar. 21, 2016, now Pat. No. 10,401,476.

(60) Provisional application No. 62/151,686, filed on Apr. 1, 2015.

(51) Int. Cl.
| | | |
|---|---|---|
| G01S 7/40 | (2006.01) | |
| G01R 31/28 | (2006.01) | |
| G01R 23/16 | (2006.01) | |
| G01S 13/34 | (2006.01) | |
| G01R 23/02 | (2006.01) | |

(52) U.S. Cl.
CPC ............ *G01S 7/4008* (2013.01); *G01R 23/02* (2013.01); *G01R 31/2834* (2013.01); *G01S 13/34* (2013.01)

(58) Field of Classification Search
CPC ........ G01S 13/106; G01S 13/282; G01S 7/40; G01S 7/4008; G01R 31/28; G01R 31/2834; G01R 31/2837; G01R 23/02; G01R 23/16
See application file for complete search history.

(56) References Cited

U.S. PATENT DOCUMENTS

| | | |
|---|---|---|
| 2010/0312517 A1 | 12/2010 | McNamara et al. |
| 2014/0111184 A1 | 4/2014 | Dalebroux |
| 2016/0291131 A1 | 10/2016 | McAleenan et al. |

*Primary Examiner* — Neel D Shah

(57) ABSTRACT

A method for characterizing a FM chirp signal generated by a device under test (DUT) is disclosed. The method comprises receiving a selection of a sample frequency and chirp duration for capturing the FM chirp signal. The method also comprises down converting the FM chirp signal and capturing the FM chirp signal using a digital pin electronics card. The method comprises obtaining a plurality of period measurements from the captured FM chirp signal using a timing measurement unit (TMU) of an automated test equipment (ATE) and converting each of the plurality of period measurements into corresponding frequency values.

15 Claims, 10 Drawing Sheets

FREQUENCY MODULATED (FM) CHIRP TESTING FOR AUTOMOTIVE RADARS USING STANDARD AUTOMATED TEST EQUIPMENT (ATE) DIGITAL PIN CHANNELS

CROSS REFERENCE TO RELATED APPLICATION

This application is a divisional of, claims the benefit of and priority to U.S. application Ser. No. 15/076,508, filed Mar. 21, 2016, entitled "FREQUENCY MODULATED CHIRP TESTING FOR AUTOMOTIVE RADARS USING STANDARD AUTOMATED TEST EQUIPMENT (ATE) DIGITAL PIN CHANNELS", and hereby incorporated by reference in its entirety, which claims the benefit of and priority to co-pending commonly assigned U.S. Provisional Patent Application Ser. No. 62/141,686, titled "FM CHIRP TESTING FOR AUTOMOTIVE RADARS USING STANDARD ATE DIGITAL PIN CHANNELS" by Roger McAleenan and Robert Bartlett, filed on Apr. 1, 2015, and which is incorporated herein in its entirety.

FIELD OF THE INVENTION

Embodiments of the present disclosure generally relate to Automatic Test Equipment (ATE) for testing electronic components.

BACKGROUND

Automatic Test Equipment (ATE) is commonly used within the field of electronic chip manufacturing for the purposes of testing electronic components. ATE systems both reduce the amount of time spent on testing devices to ensure that the device functions as designed and serve as a diagnostic tool to determine the presence of faulty components within a given device before it reaches the consumer.

In general, components, for example, electronic components or devices, micro-electronic chips, memory chips or other integrated circuits (IC), are usually tested before they are delivered to a customer. Testing may be performed in order to prove and ensure the correct functional capability of the devices. The tests are usually performed by means of an automated test equipment or test system. Examples for such ATE are the Advantest V93000 SOC for testing system on a chip and system on a package, the V93000 HSM high speed memory tester (HSM) for testing high speed memory devices and the Advantest V5000 series. The first is a platform for testing systems on a chip, systems on a package and high-speed memory devices. The latter is for testing memory devices including flash memory and multi-chip packages at wafer sort and final test.

During testing these devices under test (DUTs) are exposed to various types of stimulus signals from an ATE. The responses from such devices under test are measured, processed and compared to an expected response by the ATE. Testing may be carried out by automated test equipment, which usually performs testing according to a device specific test program or test flow. Such an automatic test system may comprise different drivers for driving certain stimuli to a DUT, in order to stimulate a certain expected response from the device under test. Receiver units of the ATE may analyze the response and generate a desired output regarding the performance of the measured device.

ATE systems can perform a number of test functions on a device under test (DUT) through the use of test signals transmitted to and coming from the DUT. The DUT Interface board is docked to the ATE system by a mechanical system that secures board and makes electrical contact using, for example, a interconnect system of pogo blocks and blind mate RF SMP connectors. An SMP connector offers a frequency range of DC to 40 GHz and is commonly used in miniaturized high frequency coaxial modules. The ATE can interface to and test semiconductor devices in package or wafer form.

Conventional ATE systems are very complex electronic systems and generally include resources such as digitizers, computers, and digital control hardware to analyze the signals from the DUT to the tester system during a session the nearly replicates the real environment envisioned for DUT operation. Test signals transmitted from the DUT at high frequencies are commonly analyzed for the modulation characteristics the DUT are capable of providing. Special features may be incorporated in the design of DUT transmitters that create swept-source or FM (frequency modulated) waveforms that are ramps (up or down) or saw tooth (both symmetrical and non-symmetrical). The FM chirp (a FM ramp waveform that occurs during a specific time-span) along with other FM waveforms is commonly used in radar (radio detection and ranging) applications to mitigate detector bandwidth limits and reduce the cost of the end application like automotive radars. The radar application is used to determine a distance or range from the transmitter to a target, and in automotive applications may also determine speed of the target.

To test the FM chirp signal, typically, high-speed oscilloscopes are used to capture the time domain signal sweeping over frequency. This measurement requires expensive wideband analog hardware, synchronized measurements, and various techniques for the processing (IQ, etc.) to characterize a chirp signal to high accuracy. Thus, this technique does not lend itself to practical ATE or economical methods for determining functionality and nominal performance.

Further, the analysis and characterization of a FM chirp, which is a high speed sweep of frequency over a very short time period (typically on the order of 100 micro-seconds) is a difficult and hardware intensive test because of the challenges involved in simultaneously capturing the swept frequency over the short time periods. Specialized bench equipment, e.g., spectrum analyzers, etc. that may be used are expensive and impractical for test floor applications in high volume testing environments. Further, high performance bench equipment does not lend itself to high volume ATE application work in general because the equipment can be time consuming to use, difficult to set up, require highly experienced and educated test floor technicians or may not integrate well with the ATE hardware. Further, specialized bench equipment such as frequency analyzers occupy a considerable amount of bench space in the testing environment and do not provide a straightforward method for characterizing the FM chirp signal, e.g., specialized bench equipment do not provide a visual indication of the FM chirp.

SUMMARY OF THE INVENTION

Accordingly, a need exists for an apparatus and/or method that addresses the problems with the approaches described above. Using the beneficial aspects of the apparatus and/or method described, without their respective limitations, embodiments of the present disclosure provide novel solutions to address these problems.

Embodiments of the present invention provide an apparatus and method for testing and characterizing FM chirp signals transmitted by a device under test (DUT), wherein the DUT may be a device used in, for example, automotive radar applications. Embodiments of the present invention reduce the complexity of measuring the FM chirp ramp rates (on a time axis) and bandwidth (end to end frequency span of the chirp) by providing several features, e.g., a visual indication of the FM chirp, the actual frequency sweep relative to the time axis, the delta frequency increment in a time unit, and a formatted data result recording the testing that confirms the FM chirp characteristics in units of Hz/second (or other equivalent unit, e.g., KHz/microsecond) and the overall functionality and performance of the DUT FM chirp.

Embodiments of the present invention test and characterize the FM chirp signal transmitted by a DUT by capturing the chirp with digital pin electronics having a suitable analog bandwidth at a clock rate based on the programmed waveform of the FM chirp and a corresponding ramp rate as set by the device under test (DUT). A software process can be employed, in one embodiment, to determine the optimal digital pin settings. Once the FM chirp is captured, embodiments of the present invention can compare the captured results against expected results to determine any irregularities in performance due to DUT imperfections, e.g., improper bandwidth (the DUT is typically programmed for a specific start and stop frequency), inaccurate rate (the ramp is expected to complete a programmed range in the programmed time), and any non-linearity in the overall ramp.

In one embodiment, a method for characterizing an FM chirp signal generated by a device under test (DUT) is disclosed. The method comprises receiving a selection of a sample frequency and chirp duration for capturing the FM chirp signal. The method also comprises down converting the FM chirp signal and capturing the FM chirp signal using a digital pin electronics card. The method comprises obtaining a plurality of period measurements from the captured FM chirp signal using a timing measurement unit (TMU) of an automated test equipment (ATE) and converting each of the plurality of period measurements into corresponding frequency values.

In another embodiment, a method for characterizing a FM chirp signal generated by a device under test (DUT) is disclosed. The method comprises receiving a selection of a sample frequency and chirp duration for capturing the FM chirp signal. Further, the method comprises down converting the FM chirp signal and capturing the FM chirp signal using a digital pin electronics card to produce a captured FM chirp signal, wherein the capturing comprises capturing samples of the FM chirp signal at a high rate at precise time intervals. The method also comprises incrementally calculating a frequency range per time interval; and calculating an average frequency corresponding to each time interval.

In a different embodiment an Automated Test Equipment (ATE) system is disclosed. The system comprises a memory comprising instructions stored therein, wherein the instructions are operable to characterize a frequency modulated (FM) chirp signal generated by a device under test (DUT). The system also comprises a processor coupled to the memory, the processor configured to operate in accordance with the instructions to: (a) receive a selection of a sample frequency and chirp duration for capturing the FM chirp signal; (b) down convert the FM chirp signal; (c) capture the FM chirp signal using a digital pin electronics card to produce a captured FM chirp signal, wherein the digital pin electronics card is operable to couple with a test-head of the ATE, and wherein the digital pin electronics card comprise a timing measurement unit (TMU); (d) obtain a plurality of period measurements from the captured FM chirp signal using the TMU; and (e) convert each of the plurality of period measurements into corresponding frequency values.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTION

Figure 1:
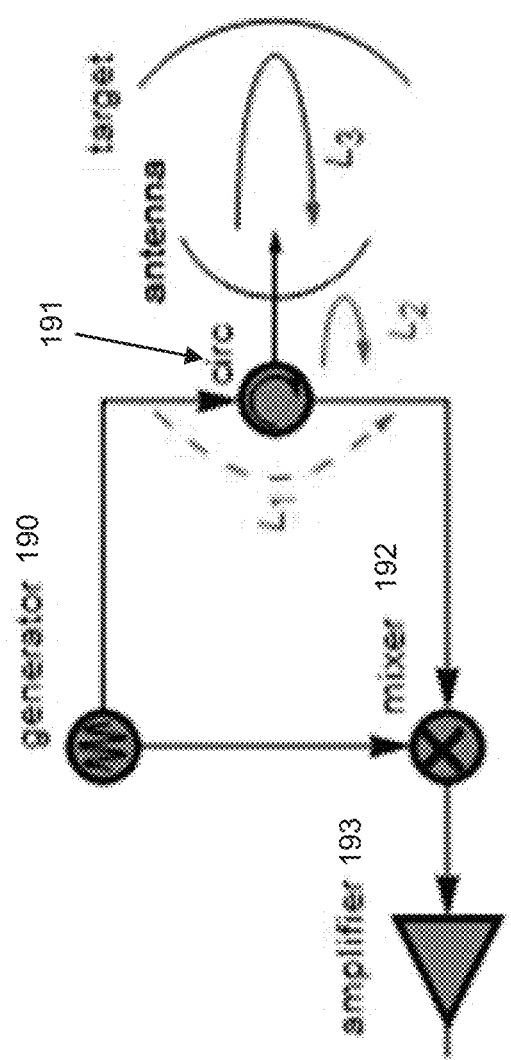
FIG. 1 is an exemplary FMCW radar system that generates a linear FM sweep.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

As discussed briefly above, in test systems for typical radar applications, test signals transmitted from the DUT at high frequencies are commonly analyzed for the modulation characteristics the DUT is capable of providing. Special features may be incorporated in the design of DUT transmitters to create swept-source or FM (frequency modulated) waveforms that are ramps (up or down) or saw tooth (symmetrical or not).

The FM chirp (a FM ramp waveform that occurs during a specific time-span) along with other FM waveforms is commonly used in radar (radio detection and ranging) to mitigate detector bandwidth limits and reduce the cost of the end application, e.g., automotive radars. The radar application is used to determine a distance or range from the transmitter to a target, and in automotive applications may also determine speed of the target. Chirp signals are a frequency modulation or angle modulation that provides unique capabilities to certain kinds of systems, e.g., radar systems. A chirped or linearly swept frequency by saw tooth or triangle waveforms is common to provide a range feature to continuous wave (CW) radar. The FM chirp is particular to radar functions and takes many forms as required by the application and corresponding receiver processor. Automotive radar chirp rates, for example, may be from 40 to 100 microseconds and are FM CW in operation. A pulse radar, for example, may be frequency modulated which provides a method to resolve targets which are overlapping. The pulse is effectively coded by FM linear chirps, non-linear, or time-frequency codes or phase modulation. FM by a chirp of a FMCW radar or within a radar pulse (pulse compression) are examples where measuring the FM characteristics is necessary. The FM chirp signal can be broadcasted by a transmitter and the transmitted and/or reflected signal can be analyzed, for example, for range, speed, and location determination.

A chirped signal is created when a sweep of frequency is made according to some function from a starting frequency to an ending frequency. A linear chirp can be created with a saw tooth waveform, for example, as noted above. Various delays, dwell times, and similar parameters are used for specific applications. The instantaneous frequency varies linearly with time. Results of the measurement are commonly given as a percent of ramp or as INL (Integral Non Linearity)/DNL (Differential Non Linearity) ratio.

Ordinary pulsed radar detects the range to a target by emitting a short pulse and observing the time of flight of the target echo reflection. This requires the radar to have high instantaneous transmit power and often results in a radar with a large, expensive physical apparatus. Frequency-modulated continuous-wave (FMCW) radars achieve similar results using much smaller instantaneous transmit powers and physical size by continuously emitting periodic signals where the frequency content varies with time. A very important type of FMCW radar signal is the linear FM sweep (wave shape sawtooth or chirp). In this case, the range to the target is found by detecting the frequency difference between the received and emitted radar signals. The range to the target is proportional to this frequency difference, which is also referred to as the beat frequency.

FIG. 1 is an exemplary FMCW radar system that generates a linear FM sweep. The signal is generated by generator 190. The signal passes through circulator 191 before being passed to mixer 192 and amplifier 193. Loss L1 and L2, as shown in the figure is a measure of the parasitic path losses within the radar electronics. These path losses contribute to unwanted phase noise in the system that reduce the range/distance the radar is capable of. Finally L3 represents total over the air loss to/from the target.

Figure 2:
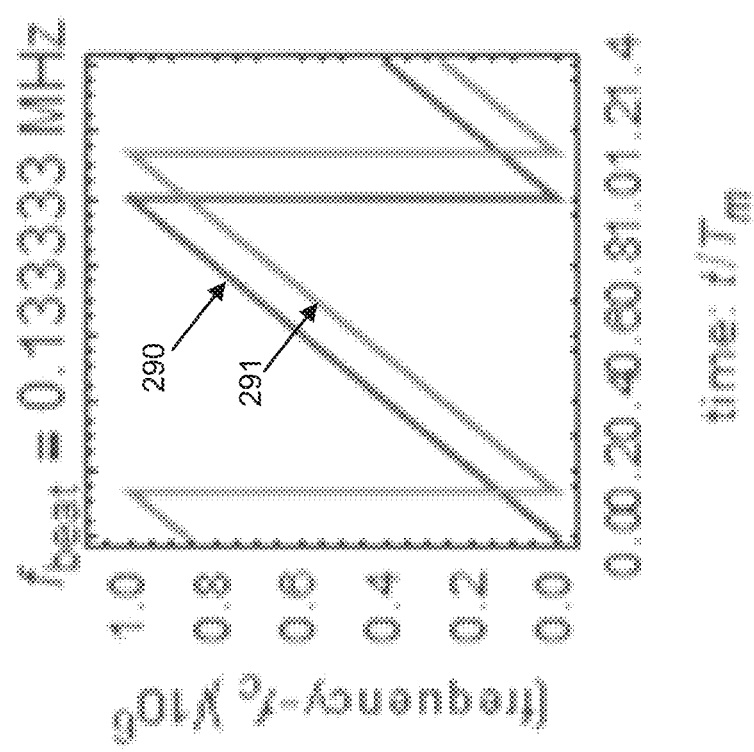
FIG. 2 illustrates the FMCW transmitted and detected ramp using the system of FIG. 1.

FIG. 2 illustrates the FMCW transmitted and detected ramp using the system of FIG. 1. Waveform 290 is the main transmitter output with the corresponding FM chirp ramp shown. Waveform 291 is the radar return signal (smaller by L3)—time shifted by the distance to the target and back.

Applications can be characterized as slow-ramp FMCW which means that the waveform is relatively slow, in milliseconds, and likely consists of several different non-symmetrical ramp shapes. Fast-ramp FMCW consists of a series of ramps commonly with the same chirp direction (up or down) or triangle waveforms at high repetition rates on the order of hundreds of microseconds. The different applications (in terms of wave shapes) are variously optimized to determine the resolution, distance, and speed in multi-target environments.

Application requirements for automotive radar chipsets have various FM chirp characteristics that are incorporated in the DUT and are programmed through the device interface. The waveform shape and duration of the shape are set by internal DUT commands in order to achieve the desired transmit signal characteristics for the environment anticipated. Selected FM chirps are commonly incorporated into the testing of each DUT transmitter. Typically, there are requirements that each mode or setting is tested and recorded against the expected value set by the control programming.

Furthermore, the difficulty in testing each and every ramp possible is time consuming and it is difficult to achieve useful results. High chirp rates of the ramp involved, the time resolution required, and the number of possibilities require a fast and accurate testing approach. A wide-band, high frequency front end is required to handle the highest frequency expected and a high speed time base that can be synchronized. The time base must sweep fast enough to match the chirp rates with fast triggering and sequencing with known or minimum delays.

Figure 3:
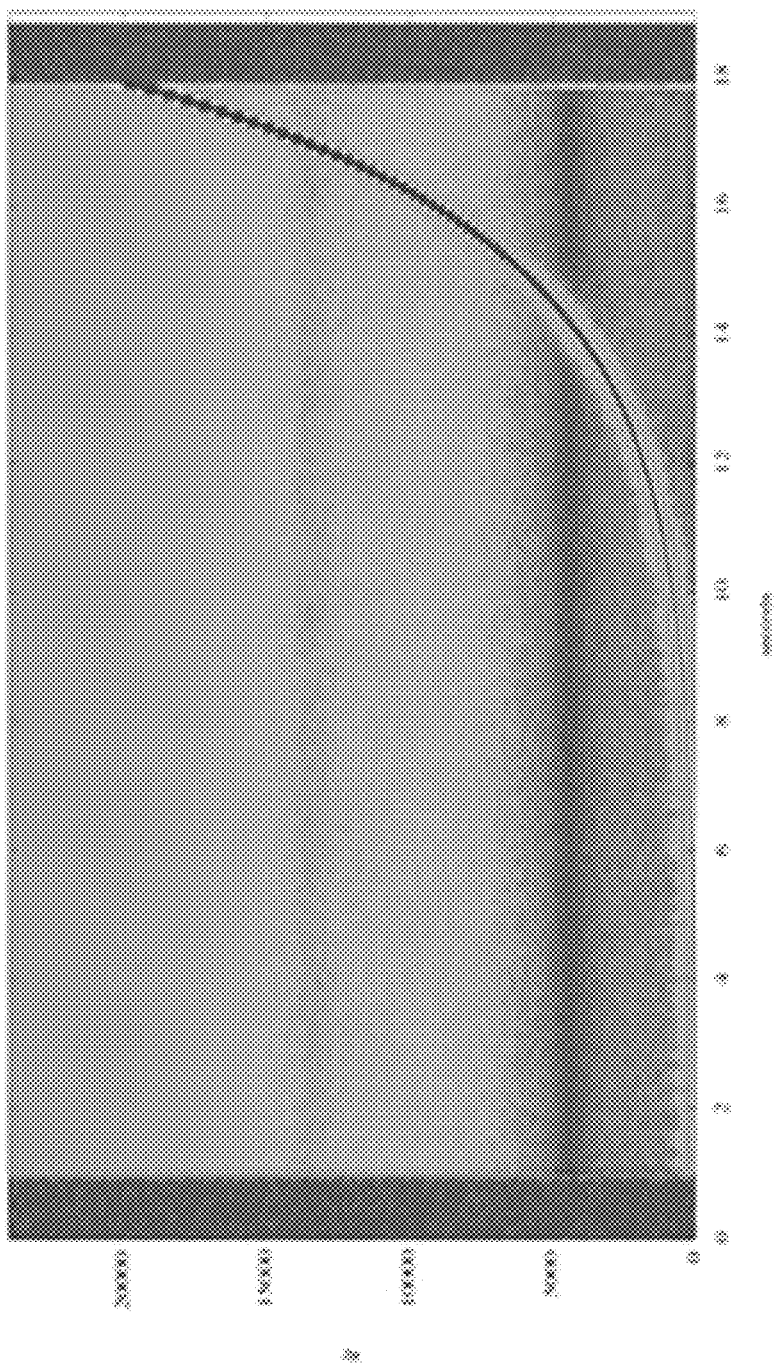
FIG. 3 is an example of a spectrogram.

FIG. 3 is an example of a spectrogram. A spectrogram is a visual representation of the spectrum of frequencies in a sound or other signal as they vary with time or some other variable. Spectrograms are sometimes also known as spectral waterfalls. FIG. 3 is a spectrogram of a non-linear chirp that demonstrates in this case an intentional non-linearity. The difficulty of capturing and analyzing chirp signals, the rate (time axis) which is variable, and where a chirp bandwidth (as seen on the y-axis, Fmax-Fmin) is significantly large makes the testing of the characteristics of the chirp important in order to determine whether the resulting characteristic is intentional or a result of poor performance of the DUT. As mentioned above, sweeping across a large differential in frequency over a very short period of time (on the order of hundreds of microseconds) is difficult and hardware intensive.

Measurement equipment for FM and specifically for chirped FM application require some very particular features. Spectrum analyzers capture amplitude versus frequency while oscilloscopes capture amplitude versus time. However, in order to analyze FM chirp signals, a combination instrument is desirable that can capture a frequency versus time representation of the signal. Additionally, as noted above, specialized bench equipment, e.g., spectrum analyzers, oscilloscopes etc. that may be used to capture and analyze FM chirp signals can be expensive and impractical. For example, a wideband, high frequency front end is required to handle the highest frequency expected and a high speed time base that can be synchronized. Also, the time-base needs to be fast enough to match the chirp rates with fast triggering and sequencing with known or minimum delays. Some prior hardware solutions have been high speed one shot digital oscilloscopes and wide band IQ receiver/demodulation. However, all prior techniques employed have used high performance bench equipment that does not lend themselves to ATE application work in general because the equipment is time consuming, difficult to set up, and may not integrate well with the ATE hardware.

Accordingly, in order to address the challenges implicit in capturing and analyzing FM chirp signals, embodiments of the present invention provide ATE methods to capture, analyze and characterize the FM waveforms (specifically chirp signals) of transmitters commonly incorporated in high frequency radar and related applications where previous measurement and analysis techniques and equipment had been only in bench testing environments. Embodiments of the present invention provide an apparatus and method for testing and characterizing DUT transmitter FM chirp signals and reducing the complexity of measuring the FM chirp ramp rates (on a time axis) and bandwidth (end to end frequency span of the chirp) by providing several advantageous features, e.g., a visual indication of the FM chirp, the actual frequency sweep relative to the time axis, the delta frequency increment in a time unit, and a formatted data result recording the testing that confirms the FM chirp characteristics in units of Hz/second (or other equivalent unit, e.g., KHz/microsecond) and the overall functionality and performance of the DUT FM chirp.

Embodiments of the present invention can be implemented in part as a software process programmed into the ATE that results in a graphical solution for the FM chirp, displaying the captured FM chirp as a function of the swept frequency over the time axis, which previously was difficult and cumbersome to do using other instruments. Embodiments of the present invention program the ATE system setups and chirp test processes through custom C++ routines and libraries. The C++ compiled code programs the ATE digital subsystem and executes a series of tests to extract the chirp raw data. The ATE system has additional custom C++ code that processes the raw data to calculate and provide a measurement of chirp linearity for the DUT. Embodiments of the present invention can be programmed and built directly into the ATE hardware so that no additional bench equipment is required, thereby, making the testing process more efficient while saving additional equipment costs. Further, embodiments of the present invention can advantageously increase the test coverage of existing ATE systems.

Further, embodiments of the present invention test and characterize the DUT transmitter FM chirp. By capturing the chirp with digital pin electronics having a suitable analog bandwidth at a clock rate based on the programmed waveform of the FM chirp, a representation of the corresponding ramp rate set by the device under test (DUT) can be demonstrated and evaluated.

Figure 4:
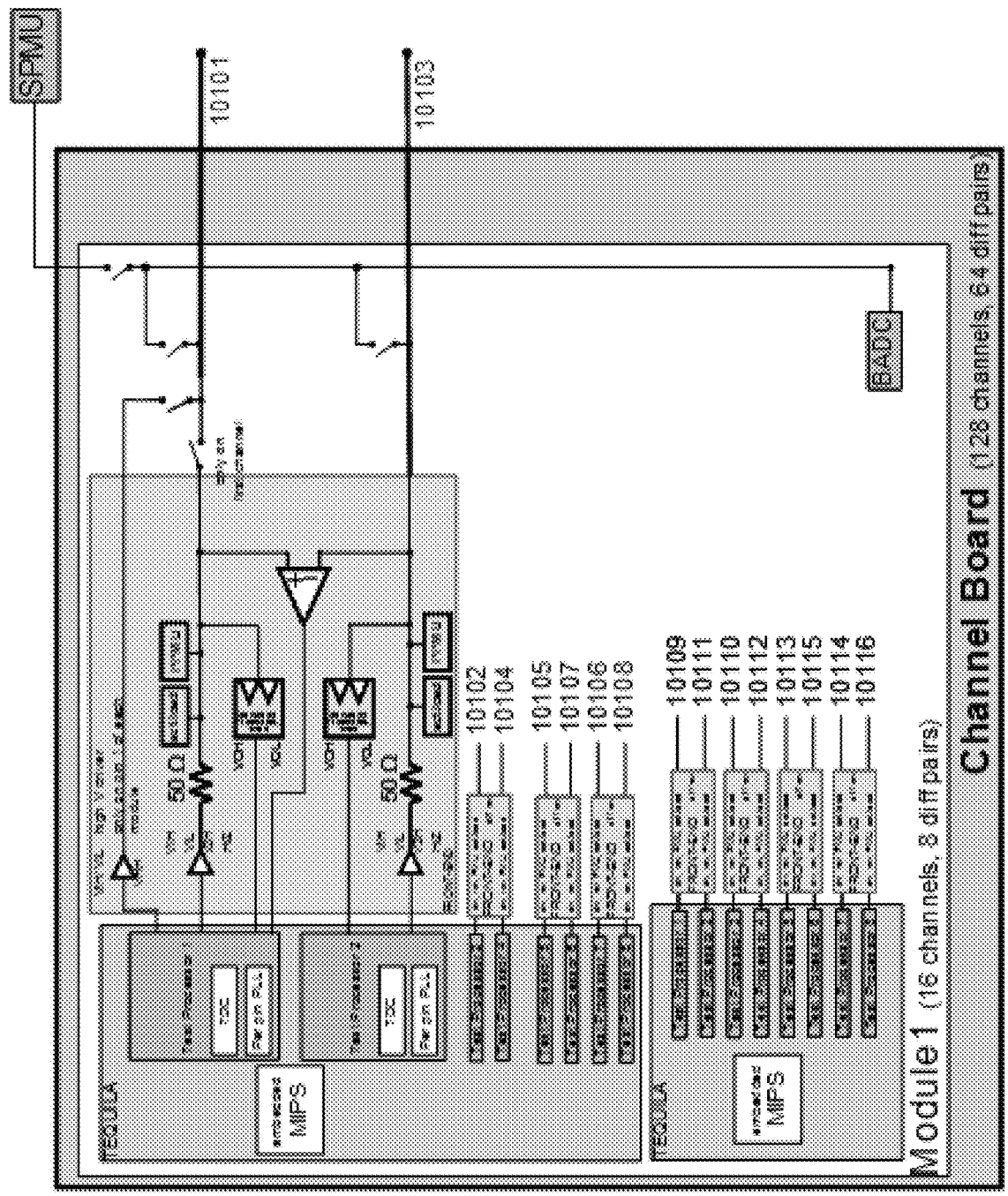
FIG. 4 is an exemplary digital pin electronic card.

FIG. 4 is an exemplary digital pin electronic card. It should be noted that a digital pin card is typically built into an ATE such as Advantest V93000 SOC that is for testing systems on a chip and systems on a package. A typical ATE system, e.g., the V93000 will comprise a test-head that can be filled by different pin electronics cards, e.g., a digital pin electronics card. Each digital pin electronics card typically contains several measurement channels, wherein each channel can be used to measure and test high-speed digital I/O interfaces. The driver/receiver in the ATE digital pin electronics card can be used, for example, not only for performing functional tests but also for AC parametric measurements (transition time, jitter, etc.) Further, the digital pin electronics card can be used for characterizing the DUT transmitter and for performing functional tests and providing stimulus signals to the DUT receiver. For example, the Advantest Pin Scale (PS) 1600 is a type of digital channel card that can be integrated into the V93000 ATE system. The digital pin card typically comprise an integrated time measurement unit (TMU) that is typically used to extract, measure and compare timing values. The TMU is a type of time to digital converter specific to certain ATE systems, e.g., the Advantest 93k systems. Examples of TMUs can be found, for example, in U.S. Pat. No. 8,825,424, titled "Apparatus and Method For Estimating Data Relating to a Time Difference and Apparatus and Method for Calibrating a Delay Line" and U.S. Pat. No. 7,782,242, titled "Time-to-digital conversion with delay contribution determination of delay elements."

In one embodiment of the present invention, a software process can be employed to determine the optimal digital pin settings on the digital pin card. For example, using the C++ language of the ATE system, a test program is written to setup the digital subsystem timing, levels and pattern sequence based on the sampling parameters calculated for the chirp rate and duration. This sequence is executed on the ATE to test the DUT and extract the raw chirp data set that is used to calculate the linearity figure of merit.

Once the FM chirp is captured, embodiments of the present invention can compare the captured results against expected results to determine any irregularities in performance due to DUT imperfections, e.g., improper bandwidth (the DUT is typically programmed for a specific start and stop frequency), inaccurate rate (the ramp is expected to complete a programmed range in the programmed time), and any non-linearity in the overall ramp.

The FM chirp capture and analysis technique employed in embodiments of the present invention is dependent on suitable external hardware down converting the expected chirp bandwidth into the digital pin electronics' bandwidth. For example, the DUT's output may be in the 75 to 80 GHz range while the digital pin electronics can only support a range of 1 to 2 GHz. This is accomplished by down converting the typically high frequency carrier into an intermediate frequency (IF) which is the input to the digital pin electronics.

Figure 5:
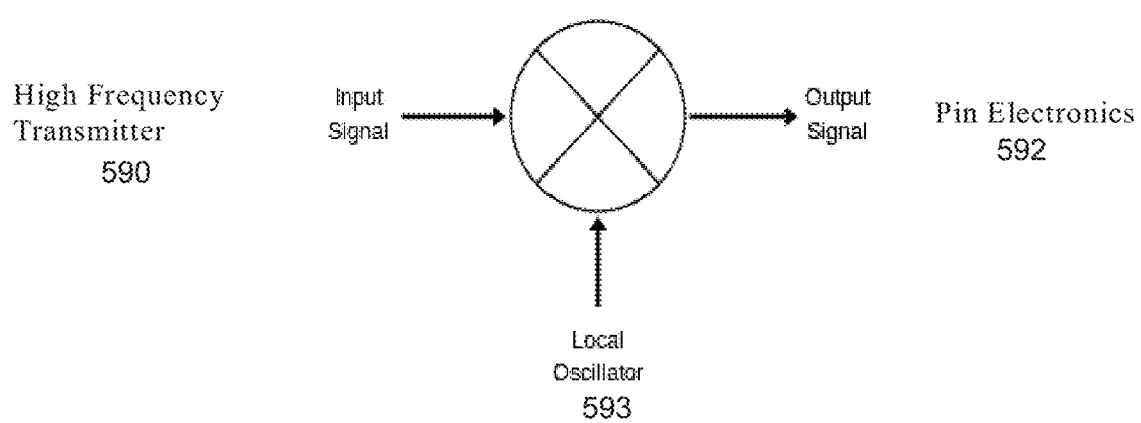
FIG. 5 illustrates exemplary circuitry that can be used to perform the down conversion of the high frequency signal generated by the DUT transmitter in accordance with an embodiment of the present invention.

FIG. 5 illustrates exemplary circuitry that can be used to perform the down conversion of the high frequency signal generated by the DUT transmitter in accordance with an embodiment of the present invention. The chirp bandwidth of radar transmitters operating at high microwave or millimeter frequencies, e.g., signal 590 is matched with the appropriate digital pin electronics 592 using local oscillator 593. Further, the IF is centered nominally for full bandwidth capture to occur by selecting the local oscillator frequency so that the chirp bandwidth is mid-band with respect to the digital pin electronic's bandwidth. The implementation of the down conversion is specific to the device frequency of operation and application. The hardware required is commonly available, e.g., the circuit illustrated in FIG. 5 and is shown only to address a method of centering the chirp bandwidth A specific advantage of this approach along with using digital pin electronics with an analog bandwidth matching that of the chirp is that a larger bandwidth can make the measurement easier as the required resolution for the measurement is less. Dividing down (using digital dividers suitable for the frequency range) the transmitter frequency reduces the chirp bandwidth by the divide ratio and increases the required time resolution to make the measurement. A divider would reduce the overall chirp bandwidth while the time duration is unchanged which would be less desirable in general and for the present application may unnecessarily reduce resolution. Down converting the transmitter signal increases the frequency change observed per sample period The techniques used in embodiments of the present invention incorporate precise timing achievable by setting the digital resources to create very uniform time intervals, as will be described further below. The resulting time intervals—either as time stamped intervals (the TMU method) or records of incremental frequency per time interval (the Digital Capture method)—are then analyzed according to a prescribed process using ATE software tools and resources to present a visual—the FM Chirp itself, an analysis of the results to common non-linearity terms like INL and DNL, or other forms.

I. The TMU Sampling Method and Data Analysis Process

Embodiments of the present invention can provide two approaches to characterizing the DUT generated FM chirp signal and calculating its bandwidth and rate. The first approach is a time-stamping method that receives the chirp signal from the DUT and uses the TMU of a digital pin card to create time stamps at the selected rate. This rate is determined using the expected maximum rate programmed into the DUT. The digital pin electronics can be programmed to receive the FM chirp signal directly from the DUT transmitter and can use the TMU to characterize and plot the FM chirp signal as will be detailed below.

The samples are plotted in a fashion that shows the incremental change of frequency (the ramp bandwidth is sectioned into small time periods) versus the time it takes to complete the ramp. The ramp and digital time stamping are synchronous in that the digital sub-system triggers the FM chirp to start. The maximum bandwidth possible (maximum frequency or end point of the ramp) is a function of the digital resources used and how the bandwidth is positioned in the capture bandwidth. Each digital resource has a maximum analog bandwidth and maximum sample rate.

Below Table 1 is an exemplary process or pseudo code to determine an adequate resolution bandwidth for the TMU sampling methodology.

TABLE 1

1) Select sampling frequency
   i. (Fs in MHz) = 25 MHz (corresponding to Ts = 40 ns)
2) Select FM Chirp duration (FMd) = 100 uS
3) Determine Number of samples
   i. (Ns) = FMd/Ts = 100e-6/40e-9 = 2,500
4) Resolution BandWidth (RBW) = (Fs*1000000)/Ns = 10 KHz
5) Calculate number of input cycles in the coherent sampling window (must be odd number of cycles) = (Fin/Fs * Ns) + 1
   i. Lower Ramp Frequency = 200 MHz Fin
     1. (200 MHz/25 MHz * 2500) + 1 = 20001
     (# of signal cycles needed)
   ii. Upper Ramp Frequency = 1000 MHz Fin
     1. (1000 MHz/25 MHz * 2500) + 1 = 100001
     (# of signal cycles needed)
6) Accordingly, 2500 (Ns) @ 25 MHz Fs will cover 200-1000 MHz span in 100 us As seen in the example above, the process for setting up the TMU sampling starts with selecting a sampling rate (Fs), e.g., 2 and a chirp duration, e.g., 100 us (steps 1 and 2), wherein both the sampling rate and chirp duration are selected strategically in order to attain a required resolution bandwidth (see step 4).

Subsequent to selecting the sampling frequency and chirp duration, the number of samples to be obtained is determined at step 3. The resolution bandwidth can then be obtained using the sampling frequency and the number of samples at step 4. If the resolution bandwidth obtained using the chosen sampling frequency and chirp duration is not less than the required or desired chirp resolution, then a different sampling frequency or chirp duration must be re-selected.

At step 5, the process determines the number of signal cycles needed at the lower and upper ramp frequencies to ensure coherence in the sampling window and prevent the effects of frequency smearing.

Figure 6:
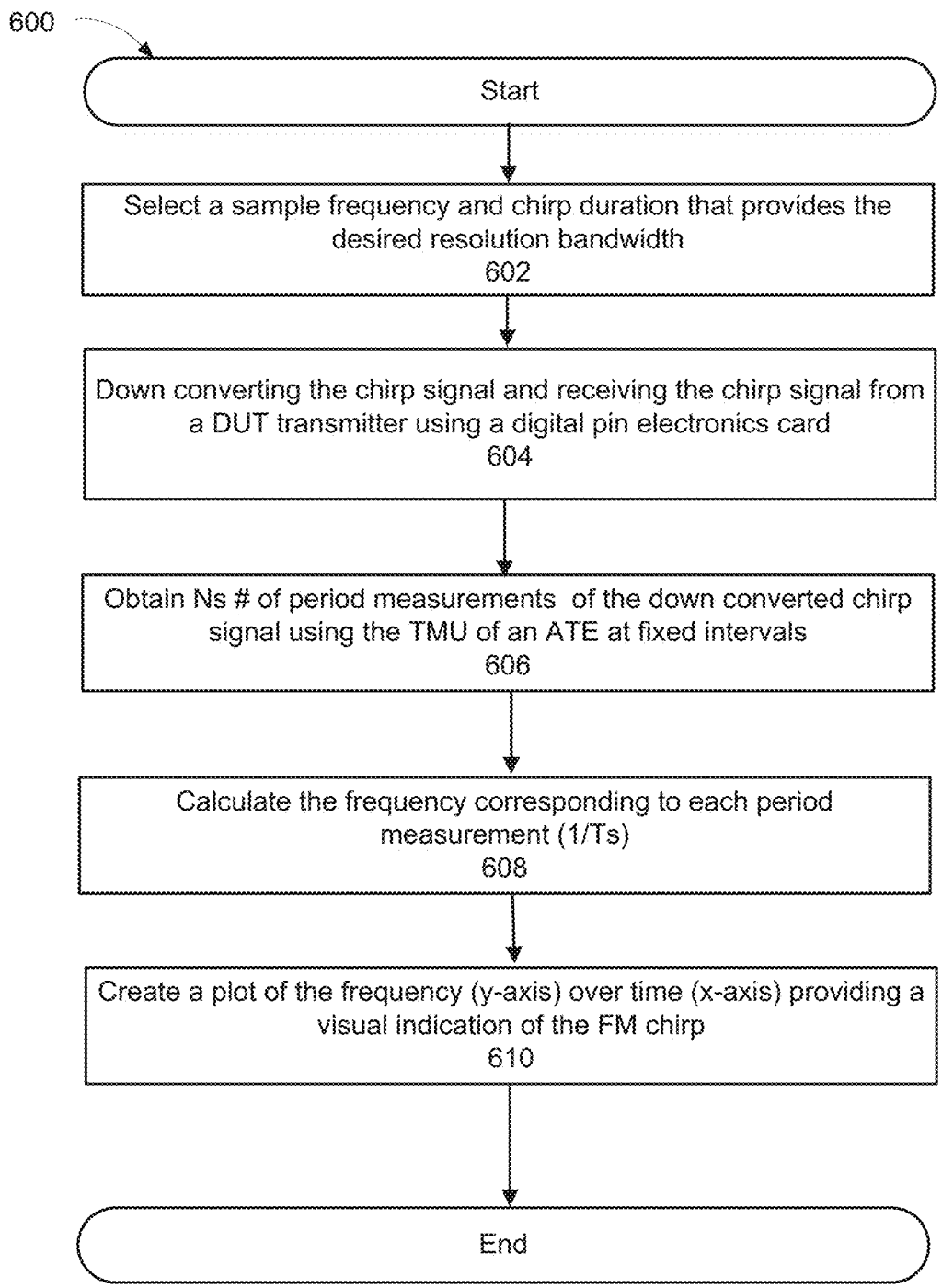
FIG. 6 is a flowchart of an exemplary method of characterizing a FM chirp signal using a TMU device in accordance with an embodiment of the present invention.

FIG. 6 is a flowchart of an exemplary method of characterizing a FM chirp signal using a TMU device in accordance with an embodiment of the present invention. As noted above, the TMU device is an integrated time measurement unit that is part of a digital pin card in an ATE system (e.g., the Advantest V93k) and is typically used to extract, measure and compare timing values. For example, the TMU can be programmed to receive a chirp signal from a DUT transmitter and create a time stamp at fixed intervals (e.g., every 40 ns), wherein the time stamp provides a reading of the last measured period of the received chirp signal (the period of the signal is measured at multiple times during each 40 ns interval by the TMU). The period measurement obtained at each time stamp (e.g. every 40 ns) can then be used to determine a frequency measurement of the chirp signal at each interval. The frequency measurement can in turn be used to create a plot of the frequency (y-axis) versus the time interval (x-axis).

At step 602, a sample frequency and chirp duration is selected that provides the tester with the desired resolution bandwidth (RBW) as discussed above. If the RBW is not less than the required chirp resolution, a different sampling rate or chirp duration would need to be selected. For the example illustrated above a sampling frequency of 25 MHz and a chirp duration of 100 us is selected.

At step 604, a test chirp signal is down converted and received using a digital pin electronics card from a DUT transmitter. As discussed above, the chirp bandwidth of radar transmitters operating at high microwave or millimeter frequencies, e.g., signal 590 is matched with the appropriate digital pin electronics 592 (as shown in FIG. 5).

At step 606, the TMU of an ATE is used to obtain an Ns (2500 in the example above) number of period measurements of the down converted chirp signal. The period measurement is the last period measurement obtained during the 40 ns interval in between the time stamps. The time scale in the example above is 0 to 100 us in 40 ns steps. Time step 1 for example is 40 ns after the start of the capture and time step 2,500 is 100 us after the start of the capture.

At step 608, the measurements obtained from the TMU are converted into corresponding frequency values.

At step 610, the frequency (y-axis) versus time interval (x-axis) is plotted which provides a visual indication of the chirp. Subsequently, the ideal Frequency/Time Interval function can be determined and a time interval comparison can be performed to find the largest positive and negative deviation over the duration and span between the captured chirp and the ideal FM chirp. Also, the worst case deviation can be calculated as a percentage from the ideal Frequency/Time Interval plot.

Figure 7:
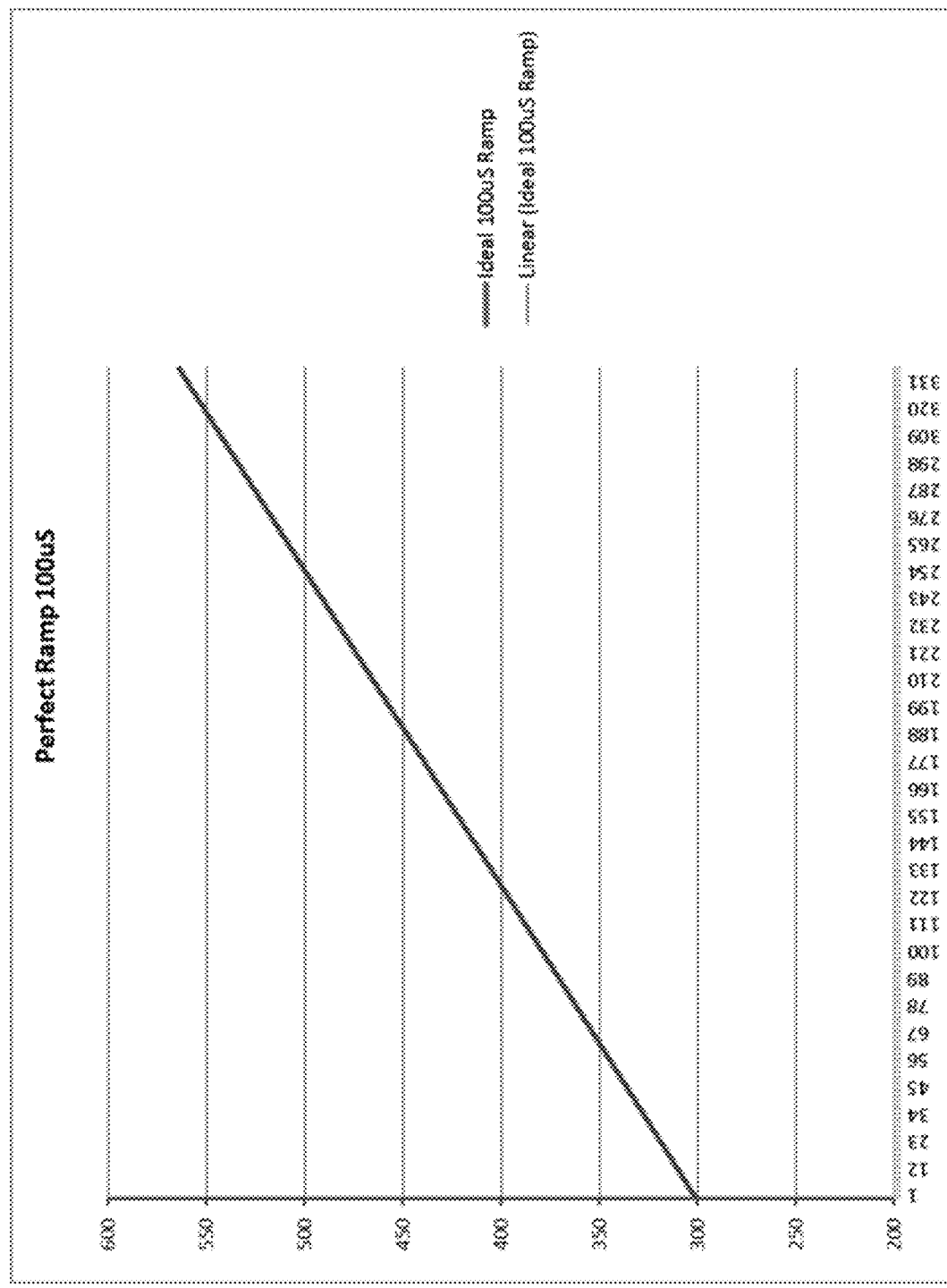
FIG. 7 illustrates an ideal FM chirp with no errors. The FM chirp illustrated in FIG. 7 is an ideal 100 us ramp that is perfectly linear.

FIG. 7 illustrates an ideal FM chirp with no errors. The FM chirp illustrated in FIG. 7 is an ideal 100 us ramp that is perfectly linear.

Figure 8:
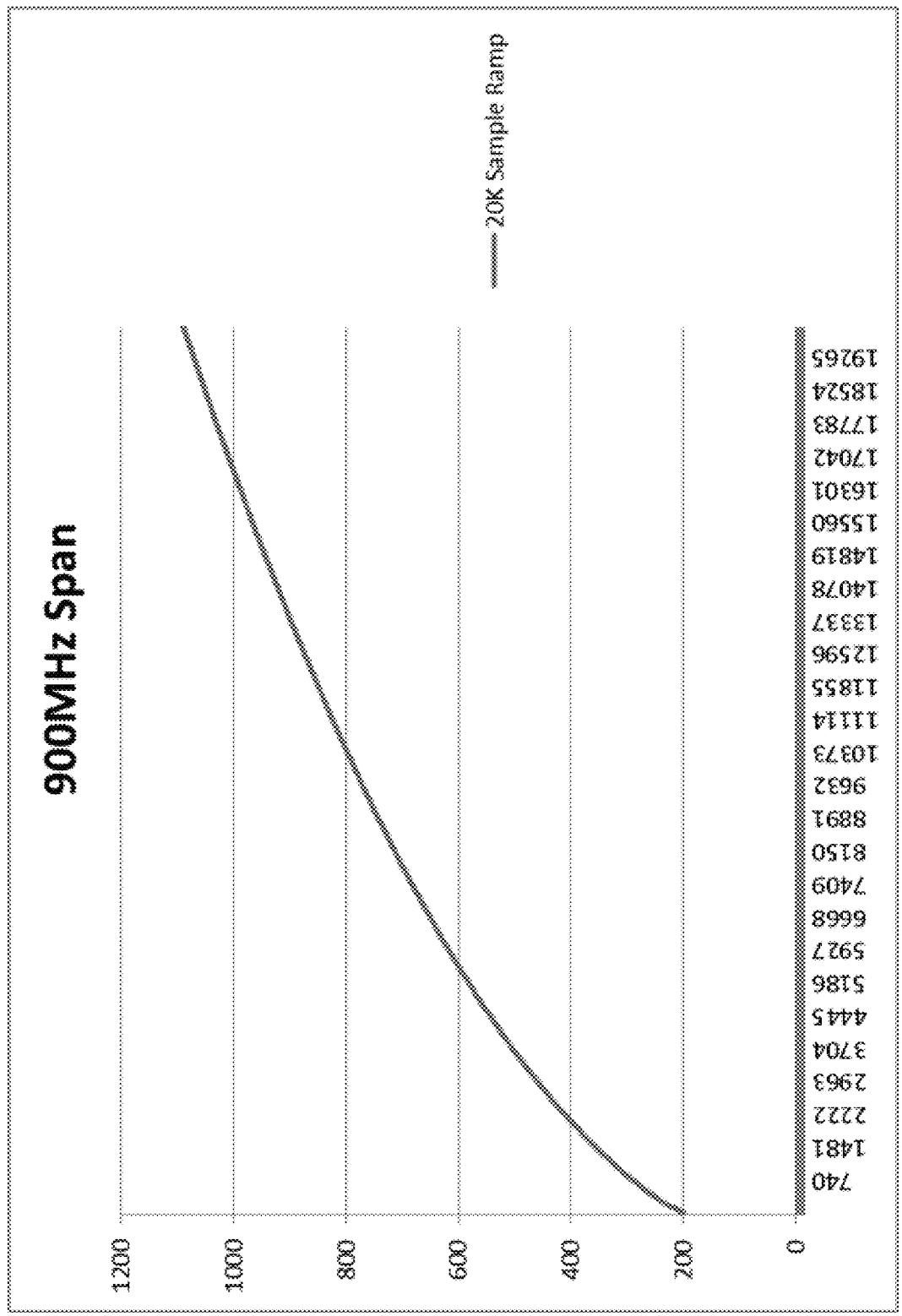
FIG. 8 illustrates a captured FM chirp from a DUT programmed to generate an FM chirp with a bandwidth of 900 MHz and a ramp rate of 100 us in accordance with an embodiment of the present invention.

FIG. 8 illustrates a captured FM chirp from a DUT programmed to generate an FM chirp with a bandwidth of 900 MHz and a ramp rate of 100 us in accordance with an embodiment of the present invention. The capture in FIG. 8 is performed using 20,000 time stamps generated by a TMU as an example. The graph shown in FIG. 8 illustrates the FM chirp capture and the corresponding non-linearity of the ramp generated during the time sweep. As compared with the ideal linear ramp of FIG. 7, FIG. 8 shows that the ramp tends to be less linear at lower start frequencies as compared to higher frequencies. Extracting a FM chirp as shown in FIG. 8 would be difficult using any other techniques except expensive bench equipment such as an IQ receiver or high speed oscilloscopes and the corresponding computations would be extensive.

Figure 9:
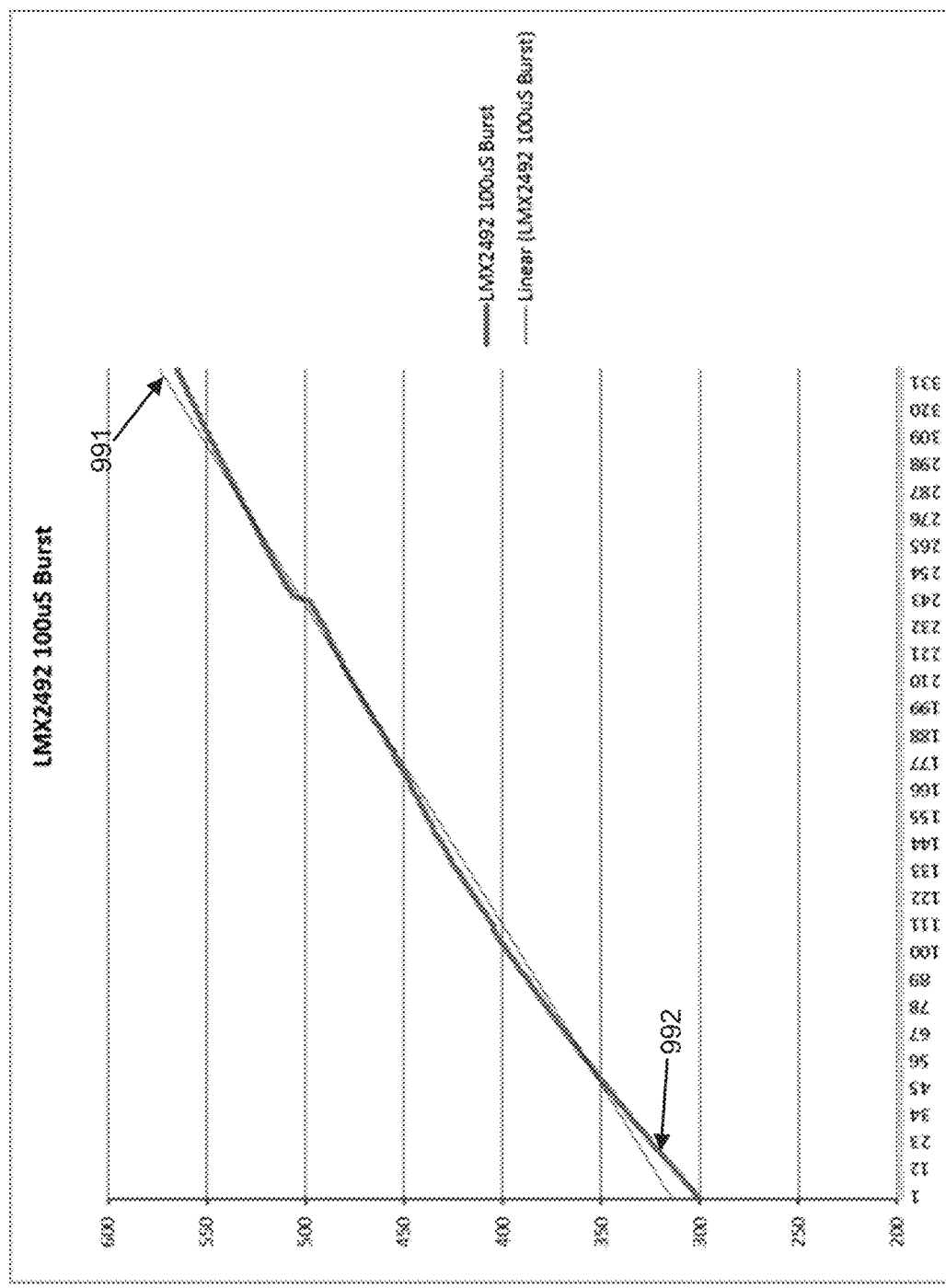
FIG. 9 illustrates a captured FM chirp plotted on the same axes as an ideal FM chirp in accordance with an embodiment of the present invention.

FIG. 9 illustrates a captured FM chirp plotted on the same axes as an ideal FM chirp in accordance with an embodiment of the present invention. As seen in FIG. 9, the captured FM chirp 992 tends to deviate from the ideal FM chirp 991 at the lower and high frequencies.

The recorded results from the capture can then be used to compare the parameters from the perfect ramp to the extracted ramp of the DUT. For example, the results can be used to determine the linearity (or non-linearity) of the captured FM chirp by using a percentage of error from the ideal ramp or an INL/DNL report. As mentioned above, several methods evaluate results: a graphical approach (plotting the minimum to maximum frequency over the expected ramp rate); an Incremental Non-Linearity/Differential Non-Linearity (INL/DNL) report; a derivative plot showing the minimum and maximum deviation from the expected ramp rate. Further, a time interval comparison can be performed to find the largest positive and negative deviation over the duration and span between the captured chirp and the ideal FM chirp. Also, the worst case deviation can be calculated as a percentage from the ideal Frequency/Time Interval plot.

In comparing the captured ramps to the expected parameters, a figure of merit can be obtained in a relatively quick manner using standard ATE digital resources where previously, the cost of the resources (for example a high speed oscilloscope or spectrum analyzer) and the incorporation of that capital into the ATE environment would be prohibitive. The testing provides a production method to assure that the ramp performance is meeting some metric without having to incorporate bench type equipment for an equivalent result.

II. The Digital Capture Sampling Method and Data Analysis Process

The Digital Capture Sampling methodology can be employed where the ATE or digital pin electronics card does not have a TMU device that can provide precise period measurements at predetermined intervals. The Digital Capture Sampling method approach is a more extensive technique where a predefined capture rate is set on a digital channel such that the incremental frequency change per sample is fine enough to provide a resolution sufficient to expose linearity errors in the waveform. Each incremental time period is analyzed to determine the actual change in incremental frequency during that interval. Successive intervals are captured and then analyzed. Several methods can be used to evaluate results: a graphical approach (plotting the minimum to maximum frequency over the expected ramp rate); an Incremental Non-Linearity/Differential Non-Linearity (INL/DNL) report; a derivative plot showing the minimum and maximum deviation from the expected ramp rate.

Below Table 2 is an exemplary process or pseudo code to determine an adequate resolution bandwidth for the digital capture sampling methodology.

TABLE 2

1) Select sampling frequency
    i. (Fs in MHz) = 800 MHz (corresponding to Ts = 1.25 ns)
2) Select FM Chirp duration (FMd) = 100 us TABLE 2-continued 3) Determine Number of samples (Ns)
    i. FMd/Ts = 100e-/1.25e-9 = 80,000
4) Resolution Band Width (RBW) = (Fs*1000000)/Ns = 10 KHz
5) Calculate number of input cycles in the coherent sampling window
    ( must be odd number of cycles) = (Fin/Fs * Ns) + 1
    i. Lower Ramp Frequency = 200 MHz Fin
        1. (200 MHz/800 MHz * 80000) + 1 = 20001
        (# of signal cycles needed)
    ii. Upper Ramp Frequency = 1000 MHz Fin
        1. (1000 MHz/800 MHz * 80000) + 1 = 100001
        (# of signal cycles needed)
Accordingly, 80,000(Ns) @ 800 MHz Fs will cover 200-1000 MHz span in 100 us As seen in the example above, the process for setting up the digital capture methodology starts with selecting a sampling rate (Fs), e.g., 2 and a chirp duration, e.g., 100 us (steps 1 and 2), wherein both the sampling rate and chirp duration are selected strategically in order to attain a required resolution bandwidth (see step 4). The sampling rate for the digital capture method is a lot higher than the TMU method.

Subsequent to selecting the sampling frequency and chirp duration, the number of samples to be obtained is determined at step 3. The resolution bandwidth can then be obtained using the sampling frequency and the number of samples at step 4. If the resolution bandwidth obtained using the chosen sampling frequency and chirp duration is not less than the required or desired chirp resolution, then a different sampling frequency or chirp duration must be re-selected.

At step 5, the process determines the number of signal cycles needed at the lower and upper ramp frequencies to ensure coherence in the sampling window and prevent the effects of frequency smearing.

Figure 10:
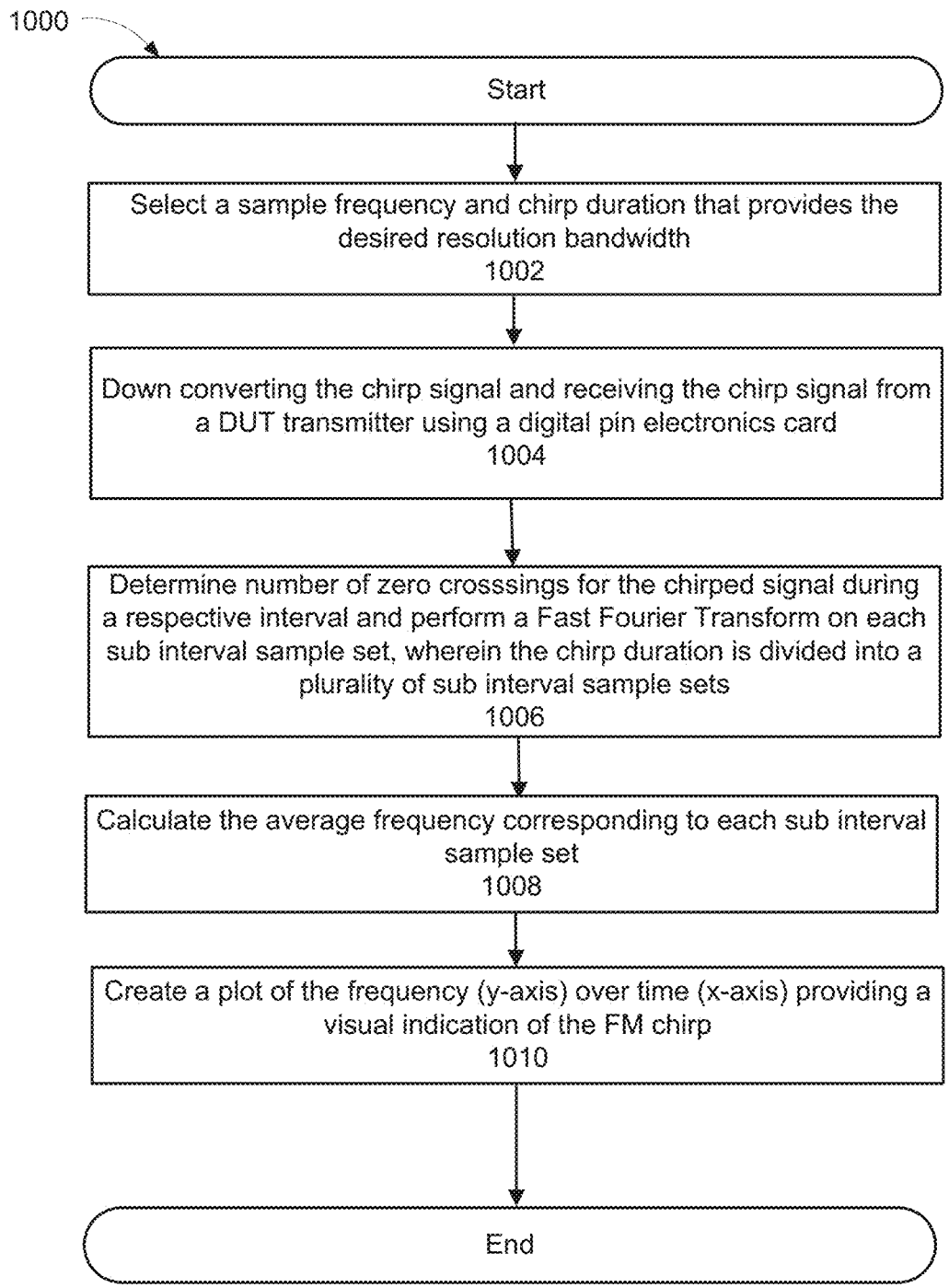
FIG. 10 is a flowchart of an exemplary method of characterizing a FM chirp signal using the digital capture methodology in accordance with an embodiment of the present invention.

FIG. 10 is a flowchart of an exemplary method of characterizing a FM chirp signal using the digital capture methodology in accordance with an embodiment of the present invention. The digital capture testing method calculates ramp performance by capturing samples at a high rate with precise time periods and then incrementally calculating frequency range per time interval.

At step 1002, a sample frequency and chirp duration is selected that provides the tester with the desired resolution bandwidth (RBW) as discussed above. If the RBW is not less than the required chirp resolution, a different sampling rate or chirp duration would need to be selected. For the example illustrated above a sampling frequency of 800 MHz and a chirp duration of 100 us is selected. Each sample interval is 1.25 ns in time from the start of the capture. As shown above, 80,000 samples are obtained at intervals of 1.25 ns.

At step 1004, a test chirp signal is down converted and received using a digital pin electronics card from a DUT transmitter. As discussed above, the chirp bandwidth of radar transmitters operating at high microwave or millimeter frequencies, e.g., signal 590 is matched with the appropriate digital pin electronics 592 (as shown in FIG. 5).

At step 1006, a frequency value for each interval can be obtained by determining the number of zero crossings the captured signal experiences during a respective time interval. Further, a Fast Fourier Transform (FFT) is performed on each 1 us sub interval sample set, wherein a 100 us chirp duration (from the example above) results in a total of 100 sub interval sample sets.

At step 1008, the average frequency is calculated for each sub interval sample sets resulting in a total of 100 average frequencies for a 100 us chirp duration.

At step 1010, the frequency (y-axis) versus time interval (x-axis) is plotted which provides a visual indication of the chirp. Subsequently, the ideal Frequency/Time Interval function can be determined and a time interval comparison can be performed to find the largest positive and negative deviation over the duration and span between the captured chirp and the ideal FM chirp. Other methods can be used to evaluate results: an Incremental Non-Linearity/Differential Non-Linearity (INL/DNL) report; a derivative plot showing the minimum and maximum deviation from the expected ramp rate calculated as a percentage from the ideal Frequency/Time interval plot.

The digital capture methodology results in a similar characterization of the FM chirp as the TMU methodology. The major difference between the methodologies is that the TMU method allows a more direct measurement of the frequencies while the digital capture method involves capturing sample at high rates with precise time periods and incrementally calculating a frequency range per time interval using FFTs.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware configurations. In addition, any disclosure of components contained within other components should be considered as examples because many other architectures can be implemented to achieve the same functionality.

The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

It should also be understood, of course, that the foregoing relates to exemplary embodiments of the invention and that modifications may be made without departing from the spirit and scope of the invention as set forth in the following claims.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. A method for characterizing a FM chirp signal generated by a device under test (DUT) using automated test equipment (ATE), the method comprising:
   receiving a user selection of a sample frequency and chirp duration for capturing the FM chirp signal;
   down converting the FM chirp signal;
   capturing the FM chirp signal using a digital pin electronics card to produce a captured FM chirp signal, wherein the capturing comprises capturing samples of the FM chirp signal at a high rate at precise time intervals;
   incrementally calculating a frequency range per time interval of the precise time intervals; and
   calculating an average frequency corresponding to each time interval.

2. The method of claim 1, wherein the sample frequency and the chirp duration are selected to obtain a desired resolution bandwidth, and further comprising:
   characterizing the captured FM chirp signal by analyzing the frequency values versus corresponding time values.

3. The method of claim 1, further comprising:
   creating a visual indication of the captured FM chirp signal by plotting the average frequency versus corresponding time values on a display unit.

4. The method of claim 1, further comprising:
   calculating a deviation of the captured FM chirp signal from an ideal FM chirp signal.

5. The method of claim 1, wherein the calculating a frequency range comprises calculating a Fast Fourier Transform (FFT) on each time interval.

6. The method of claim 1, wherein the sample frequency and the chirp duration are selected based on an expected maximum transmit rate programmed into the DUT.

7. An Automated Test Equipment (ATE) system, the system comprising:
   a memory comprising instructions stored therein, wherein the instructions are operable to characterize a frequency modulated (FM) chirp signal generated by a device under test (DUT);
   a processor coupled to the memory, the processor configured to operate in accordance with the instructions to:
   receive a user selection of a sample frequency and chirp duration for capturing the FM chirp signal;
   down convert the FM chirp signal;
   capture the FM chirp signal using a digital pin electronics card to produce a captured FM chirp signal, wherein the capturing comprises capturing samples of the FM chirp signal at a high rate at precise time intervals;
   incrementally calculate a frequency range per time interval of the precise time intervals; and
   calculate an average frequency corresponding to each time interval.

8. The system of claim 7, wherein the sample frequency and the chirp duration are selected to obtain a desired resolution bandwidth, and wherein the processor is further configured to operate in accordance with the instructions to:
   characterize the captured FM chirp signal by analyzing the frequency values versus corresponding time values.

9. The system of claim 8, wherein to receive a selection of a sample frequency and chirp duration for capturing the FM chirp signal the processor is further configured to: re-select the sample frequency and the chirp duration if a resulting resolution bandwidth is not less than the desired resolution bandwidth.

10. The system of claim 7, wherein the processor is further configured to:

create a visual indication of the captured FM chirp signal by plotting the average frequency versus corresponding time values on a display unit.

11. The system of claim 7, wherein the processor is further configured to:
calculating a deviation of the captured FM chirp signal from an ideal FM chirp signal.

12. The system of claim 11, wherein the processor is further configured to:
generate an Incremental Non-Linearity/Differential Non-Linearity (INL/DNL) report.

13. The system of claim 11, wherein the processor is further configured to:
generate a derivative plot showing a minimum and maximum deviation from an expected ramp rate calculated as a percentage from an ideal frequency versus time interval plot.

14. The system of claim 7, wherein to calculate the frequency range per time interval, the processor is configured to calculate a Fast Fourier Transform (FFT) on each time interval.

15. The system of claim 7, wherein the sample frequency and the chirp duration are selected based on an expected maximum transmit rate programmed into the DUT.

* * * * *